US006573747B2

(12) United States Patent
Radhakrishnan (10) Patent No.: US 6,573,747 B2
(45) Date of Patent: Jun. 3, 2003

(54) DIGITAL UPDATE SCHEME FOR ADAPTIVE IMPEDANCE CONTROL OF ON-DIE INPUT/OUTPUT CIRCUITS

(75) Inventor: Prakash K. Radhakrishnan, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 57 days.

(21) Appl. No.: 09/965,627

(22) Filed: Sep. 28, 2001

(65) Prior Publication Data

US 2003/0062920 A1 Apr. 3, 2003

(51) Int. Cl.$^7$ .............................................. H03K 17/16
(52) U.S. Cl. ............................ 326/30; 326/32; 326/34
(58) Field of Search ............................ 326/30, 32, 34, 326/86, 87

(56) References Cited

U.S. PATENT DOCUMENTS

| | | | |
|---|---|---|---|
| 4,719,369 A | * 1/1988 | Asano et al. ............... 307/443 |
| 5,095,231 A | 3/1992 | Sartori et al. ............... 307/475 |
| 5,134,311 A | 7/1992 | Biber et al. ................. 307/270 |
| 5,559,447 A | 9/1996 | Rees ............................ 326/30 |
| 5,677,639 A | 10/1997 | Masiewicz .................... 326/82 |
| 5,955,894 A | 9/1999 | Vishwanthaiah et al. ..... 326/86 |
| 6,049,221 A | * 4/2000 | Ishibashi et al. ............. 326/30 |
| 6,114,898 A | 9/2000 | Okayasu ..................... 327/437 |

\* cited by examiner

*Primary Examiner*—Michael Tokar
*Assistant Examiner*—Anh Q. Tran
(74) *Attorney, Agent, or Firm*—Antonelli, Terry, Stout & Kraus, LLP

(57) ABSTRACT

An adaptive impedance matching arrangement has an adaptive impedance circuit and a control circuit. The adaptive impedance circuit matches the impedance of a bus and is controlled according to control bits supplied by the control circuit. The control bits are updated according to a signal indicating the state of a queue maintaining transactions for the bus.

14 Claims, 4 Drawing Sheets

DIGITAL UPDATE SCHEME FOR ADAPTIVE IMPEDANCE CONTROL OF ON-DIE INPUT/OUTPUT CIRCUITS

FIELD

The present invention is directed to adaptive impedance control of input/output circuits. More particularly, the present invention is directed to update schemes for adaptive impedance control of input/output circuits.

BACKGROUND

Figure 1:
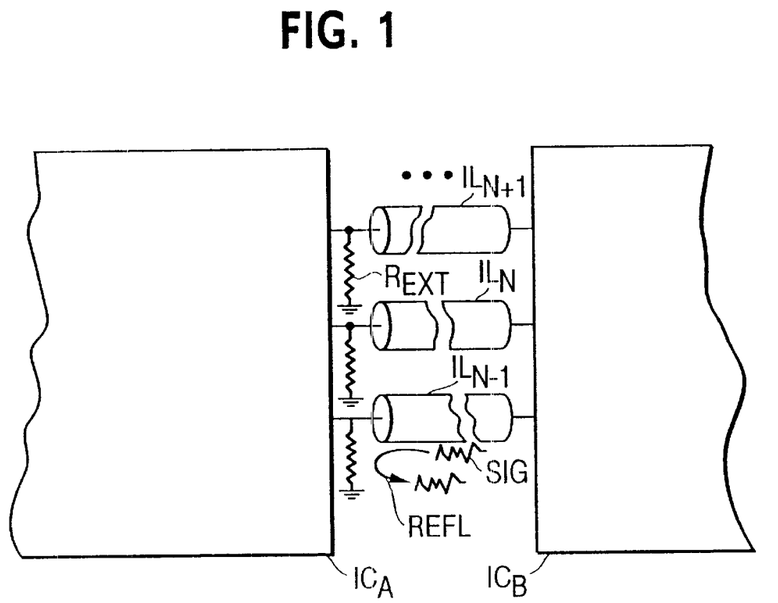
FIG. 1 is a plan view of two ICs having signal transmission paths arranged therebetween, such figure being useful in describing background material.

If an input/output (I/O) data signal experiences any discontinuity (e.g., change in impedance) during transfer, such signal can experience undesirable effects such as signal reflection. FIG. 1 shows a first integrated circuit (IC) numbered $IC_A$, a second IC numbered $IC_B$, and a plurality of transmission lines $IL_{N-1}$, $IL_N$, $IL_{N+1}$ connected to I/O terminals and providing signal transmission paths therebetween, with the illustration of "●●●" indicating that there may be many more (e.g., hundreds of) I/O terminals and transmission lines interconnected therebetween. A I/O terminal may include a pad cell containing a driver/receiver circuit composed of, for example, a pair of connected inverters (not shown) or it may include some other arrangement of elements. Also, the transmission lines $IL_{N-1}$, $IL_N$, $IL_{N+1}$ may be connected to a characteristic external impedance $R_{ext}$, of, for example, 50 ohms (Ù). If $IC_A$ outputs a signal SIG from an I/O terminal onto transmission line $IL_{N-1}$, such signal SIG will travel along transmission line $IL_{N-1}$, and unless the impedance of an I/O terminal of $IC_B$ is matched, such traveling signal will experience discontinuity and will experience undesirable effects such as a signal reflection REFL. Such reflection REFL is undesirable because it lessens a signal strength of the signal SIG which is actually inputted into $IC_B$, and travels back to $IC_A$. It may then reflect back from $IC_B$ if it is not matched to the transmission line impedance, and this reflection may interfere with subsequent signal reception at $IC_B$ and with the edge rate (slew rate) of the data signal.

IC manufacturing processes vary substantially from manufacturing lot to manufacturing lot, and as a result of such manufacturing variations, IC components correspondingly vary making it very difficult and/or cost prohibitive to match impedances with high precision at the time of manufacture. Further, even if such precision could be provided at the time of manufacture, such approach would still be disadvantageous insofar as it does not allow for adjustment to varying transmission lines, and for continuous voltage and temperature compensations. That is, voltage and temperature environments, for example, within an IC and/or on signal transmission lines change over time during the operation of an apparatus. Accordingly, adaptive impedance control circuits can be provided on the die of an IC which "continuously" adapt to such changes over time in order to match impedances and thus control reflections and the edge rate of the data signal transferred across a transmission line. With such on-die impedance matching, little discontinuity and minimal reflections are experienced by the data signal at the end of the transmission line.

There are various update schemes for such adaptive impedance control circuits. Update schemes may, for example, either put the bus on hold or issue a special transaction on the I/O to do an update or simply decode all the 4 bits and do a linear or gray code update to prevent glitches on the bus. Thermometer coded bits may be used for

2 both pullup and pulldown impedance control. This requires a lot of routing channels to all the pad cells. An asynchronous updating scheme cannot be used for this pulldown driver since it will cause output timing pushout if the update occurs during data transition. A driver idle update scheme may update the controlled impedance when the bus is idle. This approach has the disadvantage that the update may never happen within the time delay of the impedance drift due to temperature or voltage changes.

A complicated scheme may be used to do the pulldown impedance update in which, not only are the thermometer bits distributed to each pad cell, there are two control bits distributed to each pad cell. These two bits indicate when the actual update is done on the pulldown. The delay for these two bits is decided by the control bits from the frequency governor which changes the delay depending on the bus clock ratio.

BRIEF DESCRIPTION OF THE DRAWING(S)

While the drawings and the following detailed description focus on disclosing example embodiments, it should be clearly understood that the same is by way of illustration and example only and that the invention is not limited thereto. The following represents brief descriptions of the drawings, wherein.

DETAILED DESCRIPTION

Before beginning a detailed description of the example embodiments, mention of the following is in order. When appropriate, like reference numerals and characters may be used to designate identical, corresponding or similar components in differing figure drawings. Further, in the detailed description to follow, example sizes/models/values/ranges may be given (e.g., in parenthesis), although the example embodiments are not limited to the same. Still further, figures are not necessarily drawn to scale, and exemplary and critical values are mentioned when appropriate. With regard to description of any timing signals, the terms assertion/activate and negation/deactivate may be used in an intended generic sense. More particularly, such terms are used to avoid confusion when working with a mixture of signals, and to represent the fact that the invention is not limited to the illustrated/described signals, but could be implemented with a total/partial reversal of any of the "active-low" and "active-high" signals by a simple change in logic. More specifically, the terms "assert" or "assertion" indicate that a signal is active independent of whether that level is represented by a high or low voltage, while the terms "negate" or "negation" indicate that a signal is inactive. As a final note, well known power connections to ICs and other components may not be shown within the figures for simplicity of illustration and discussion, and so as not to obscure the example embodiments of the invention. Further, arrangements may be shown in block diagram form in order to avoid obscuring the example embodiments of the invention, and also in view of the fact that specifics with respect to implementation of such block diagram arrangements may be highly dependent upon the platform within which it is to be implemented, i.e., such specifics should be well within purview of one skilled in the art. Where specific details (e.g., circuits, flowcharts) are set forth in order to describe example embodiments of the invention, it should be apparent to one skilled in the art that the invention can be practiced without, or with variation of, these specific details. Finally, it should be apparent that differing combinations of hard-wired circuitry can be used to implement the example embodiments of the invention.

Although the example embodiments of the present invention are described in the environment of a microprocessor IC having core logic, a bus sequencing unit for arranging the transfer of data between the core logic and an external bus, and I/O circuits for driving and receiving data on the bus, the example embodiments and the invention is not limited thereto, i.e., the example embodiments may be practiced in other types of IC chips having I/O circuits (e.g., digital signal processors, etc.).

Example Adaptive Impedance Matching Arrangements

Figure 4:
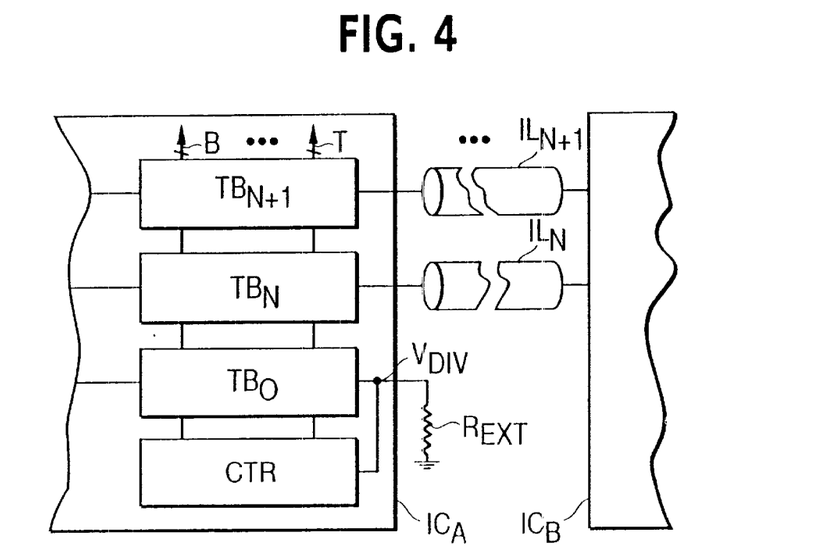
FIG. 4 is a plan view including block diagrams describing a general layout which may be provided on-die for adaptive arrangements.

FIG. 4 is a plan view including block diagrams describing an example adaptive impedance matching arrangement for an IC chip. More particularly, illustrated is an $IC_A'$ having an example generic on-die arrangement of a controller CTR block, and a plurality of transistor blocks $TB_0$, $TB_N$, $TB_{N+1}$, with the illustration of "•••" being indicative that there may be many transistor blocks and transmission lines. Typically, there will be a binary number of transmission lines, such as 64, in a data bus. The internal constructions/arrangements within all of the transistor blocks $TB_0$, $TB_N$, $TB_{N+1}$, ••• may be identical, which is advantageous in terms of using redundancy during design/manufacturing of $IC_A'$. Transistor block $TB_N$ is connected to an I/O terminal having, for example, a Gunning-transceiver-logic (GTL) or other kind of transceiver (not shown), which in turn is connected through a pin or other connection to transmission line $IL_N$; transistor block $TB_{N+1}$ is connected to a different I/O terminal which in turn is connected to transmission line $IL_{N+1}$; and so on.

In contrast to $TB_N$, $TB_{N+1}$ which service transmission lines, transistor block $TB_0$ is used as a reference or "dummy" transistor circuit block. Such dummy transistor circuit block is used together with controller CTR and external resistor $R_{EXT}$ to determine which ones and/or how many of parallel legs of transistors must be turned on to impedance match an expected characteristic impedance of a transmission line connected to any I/O terminal of $IC_A'$. While the present disclosure describes an embodiment having a single dummy transistor circuit block $TB_0$ and a single controller CTR, practice of the present invention is not limited thereto, i.e., there can easily be multiple dummy transistor circuit blocks and multiple controllers provided on a single die. Such may be advantageous in a number of regards. For example, temperatures can vary greatly across a die, and thus, localized dummy transistor circuit blocks and controllers can be used to provide more accurate localized compensation. Further, redundant dummy transistor circuit blocks and controllers could offer back-up protections in the event of failure or one of the dummy reference transistor circuit blocks or controller.

Typically the characteristic impedance of transmission lines connected to I/O terminals of $IC_A'$ are known and/or can be measured, and once known or measured, a precision external resistor $R_{EXT}$ of corresponding value may be provided on the printed circuit board to serve as a reference impedance to attempt to match to. Alternatively, instead of precision external resistor $R_{EXT}$, other types of arrangements can be used, e.g., a dummy transmission line $IL_D$ (not shown) having a similar impedance as other transmission lines $IL_N$, $IL_{N+1}$, ••• may be used, or one of the actual transmission lines $IL_N$, $IL_{N+1}$, ••• may be used (e.g., during inactive times).

An example method which may be used to match the impedance provided by the dummy transistor circuit block $TB_0$ to the external resistor $R_{EXT}$ is as follows. When appropriate ones and/or number of parallel legs of transistors within transistor block $TB_0$ are turned on (i.e., activated) such that a voltage measured at point $V_{div}$ is one half (½) a voltage V impressed across the series combination of the external resistor $R_{EXT}$ and the active parallel legs of transistors within transistor block $TB_0$, then it is known that the external resistor $R_{EXT}$ and active parallel legs of transistors within transistor block $TB_0$ are equally sharing/dividing the voltage V. That is, if two series portions are equally sharing/dividing a voltage, then such two series portions have the same impedance. Accordingly, as a result of the above method, $TB_0$ has had the resistance it applies to line $L_0$ "adapted" to external resistor $R_{EXT}$, as the active parallel legs of transistors within transistor block $TB_0$ are providing an impedance which matches that of external resistor $R_{EXT}$. This arrangement is advantageous over that shown in FIG. 1 insofar as, at most, only one precision external resistor $R_{EXT}$ need be provided per IC, and hence, additional manufacturing costs, time, complexity, and PCB space (i.e., real estate) consumption, associated with numerous resistors per IC are avoided.

Once it is known as to which parallel legs of transistors should be turned on within the reference transistor block $TB_0$ to impedance match to the external resistor $R_{EXT}$, such information can be routed to all other on-die transistor blocks so as to activate corresponding parallel legs of transistors within each transistor block. Such will cause all such on-die transistor blocks to provide an impedance which matches the characteristic impedance of attached transmission lines IL, given the fact that the value of external resistor $R_{EXT}$ was originally chosen to match the expected characteristic impedance of the transmission lines IL. Routing of such information to transistor blocks TB across the die can be accomplished using an appropriate number of routing bit lines (such as FIG. 4 binary bit lines B and/or thermometer bit lines T) which traverse transistor blocks TB of interest. In the interest of brevity, routing will not be substantially discussed again, and instead, a remainder of this disclosure will focus on example update schemes for adaptive impedance matching arrangements.

Figure 5:
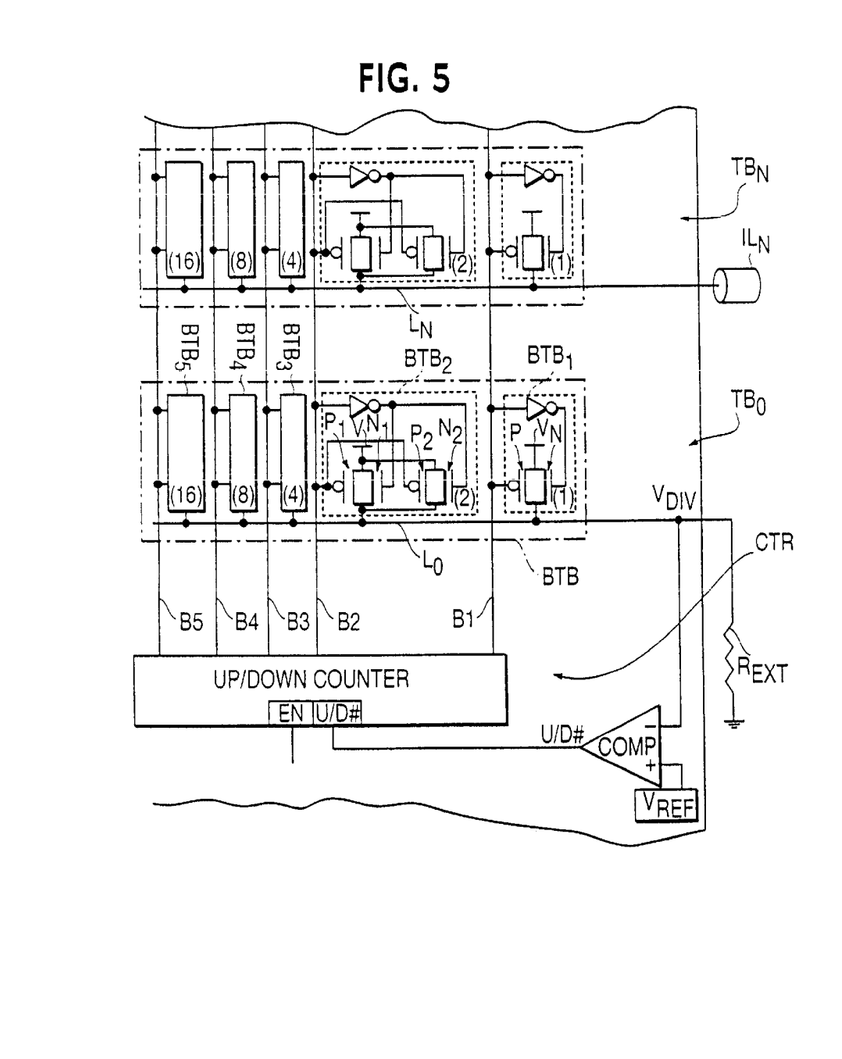
FIG. 5 is a magnified and more detailed view of a portion of FIG. 4, with FIG. 5 illustrating details of an example binary adaptive arrangement.

Turning now to a more specific example embodiment, FIG. 5 is a magnified and more detailed view of a portion of FIG. 4, with FIG. 5 illustrating details of an example binary adaptive arrangement. A single parallel pair or "leg" of P and N transistors comprises binary transistor block $BTB_1$, with a designation "(1)" again being used within the lower right-hand corner of such block to numerically designate that such block has one (1) leg. In contrast, binary transistor block $BTB_2$ in FIG. 5 has a binary increase (over the previous binary transistor block $BTB_1$) of two (2) legs or pairs of P and N transistors, with a designation "(2)" now being used within the lower right-hand corner of such block to numerically designate that such block has two (2) legs. Binary transistor block $BTB_3$ has a binary increase or (4) legs or pairs of P and N transistors (as indicated by the designation "(4)" being used within the lower portion of such block), binary transistor block $BTB_4$ has a binary increase or (8) legs or pairs of P and N transistors (as indicated by the designation "(8)" being used within the lower portion of such block), and finally, binary transistor block $BTB_5$ has a binary increase or (16) legs or pairs of P and N transistors (as indicated by the designation "(16)" being used within the lower portion of such block).

All of the legs in the example of FIG. 5 provide a certain value of resistance, e.g., 500Ü. In contrast to FIG. 5, a plurality of legs can be placed in a series and/or parallel arrangement with one another, and ones of such legs can be selectively activated/deactivated to provide a plurality of different values of resistance. For sake of brevity of discussion, this disclosure focuses on arrangements having a plurality of legs in parallel (not series), as will become more apparent from the disclosure to follow, although the invention is not limited to the same.

Figure 3:
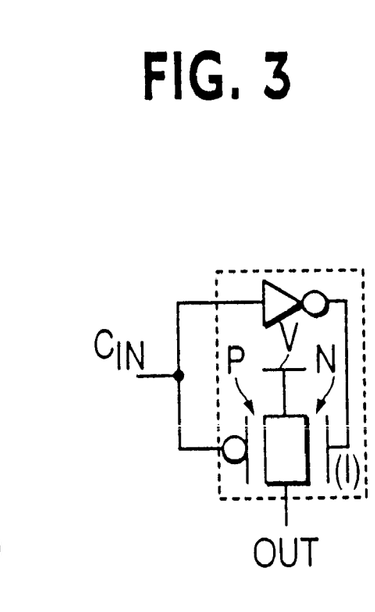
FIG. 3 is a circuit diagram describing a transistor block which may be used in on-die adaptive arrangements.

FIG. 3 is a circuit diagram of an example having a combination of a P-type transistor P and an N-type transistor N, connected in parallel across a voltage source V and an output OUT. A control input $C_{IN}$ is connected to the gate of the P transistor, and is also connected through an inverter to the gate of the N transistor. Accordingly, whenever the appropriate control input $C_{IN}$ is applied, both the P and N transistors are on simultaneously.

Figure 2:
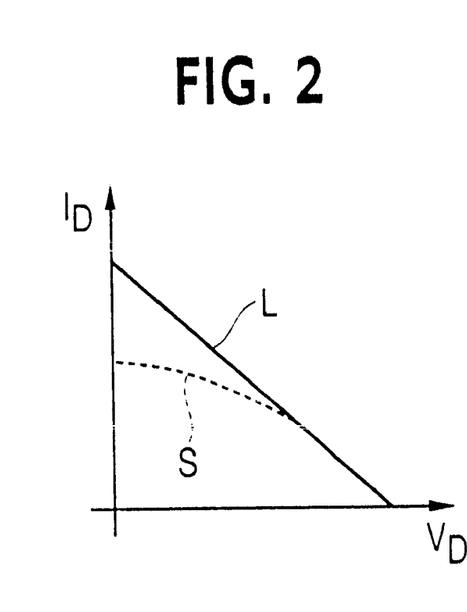
FIG. 2 is a graph describing theory behind transistor blocks which may be used in on-die adaptive arrangements.

The example parallel combination of the P and N transistors in FIG. 3 is advantageous in terms of space savings on-die in that such transistors share common voltage source V and output OUT connections. Furthermore, by tweaking and selecting P and N to differing sizes, the linear voltage-current (V-I) characteristic curve L illustrated in the graph of FIG. 2 can be achieved. While an actual resistor has a linear voltage-current (V-I) characteristic curve such as that illustrated as straight line L in the graph of FIG. 2 (illustrating a graph of a transistor's drain terminal voltage verses drain terminal current), FIG. 2 shows that a transistor has a partial linear and partial non-linear V-I characteristic curve such as that illustrated as by line S. The leg having the parallel combination of P-type and N-type transistors shown in FIG. 3 provides a "resistance" which has a linear voltage-current (V-I) characteristic curve such as that illustrated as straight line L in the graph of FIG. 2.

The outputs of all of the binary transistor blocks $BTB_1$, $BTB_2$, $BTB_3$, $BTB_4$, $BTB_5$, shown in FIG. 5 are connected to line $L_0$ which is connected to the I/O terminal of $IC_A'$, which in turn is connected to precision external resistor $R_{EXT}$. The transistors in these transistors blocks are sometimes referred to as "pull-up" transistors. Although not shown in FIG. 5 for clarity, there may be a corresponding arrangement of "pull-down" transistors mirroring the pull-up transistors shown in FIG. 5 which are also connected to line $L_0$ but which are connected to a lowering voltage, such as ground, instead of to voltage V shown in FIG. 5.

The binary transistor blocks $BTB_2$, $BTB_3$, $BTB_4$, $BTB_5$, have an advantage that each has a capability where multiple legs or pairs of P and N transistors can be arranged to be controlled (e.g., activated) by a respective, singular common binary bit line B, i.e., $BTB_2$ has two (2) P/N transistor legs or pairs which can be controlled by a single common binary bit line $B_2$, $BTB_3$ has four (4) P/N transistor legs or pairs which can be controlled by a single common binary bit line $B_3$, $BTB_4$ has eight (8) P/N transistor legs or pairs which can be controlled by a single common binary bit line $B_4$, and $BTB_5$ has sixteen (16) P/N transistor legs or pairs which can be controlled by a single common binary bit line B5. More particularly, thirty-one (31) P/N transistor legs or pairs may be controlled by a total of five binary bit lines $B_1$, $B_2$, $B_3$, $B_4$, $B_5$.

By applying appropriate assertion (i.e., activating) signals to appropriate ones or combinations of binary bit lines $B_1$, $B_2$, $B_3$, $B_4$, $B_5$, any number of P/N transistor legs or pairs from one leg to thirty-one legs may be activated so as to provide any one of thirty-one differing resistance values, i.e., activation of one leg would provide a greatest resistance value, whereas activation of all thirty-one parallel legs would provide the least resistance value. The number of legs and resistance range in FIG. 5 is an example only, i.e., the number of the legs in any given die implementation should be determined on a basis of an acceptable resistance range which could be needed to compensate for all possible IC manufacturing and operation (e.g., temperature, voltage) variations, including various operating corners of process, voltage and temperature. For example, a die meant for use in general applications and/or within normal environments might require a predetermined resistance range, whereas a die meant for use in military, space or high performance applications or environments might require a higher resistance range (i.e., military, etc., applications typically experience a wider range of temperature variations, which causes a wider variation of resistance changes).

A sense amplifier or comparator COMP is connected to receive a voltage from the point $V_{div}$ and to compare the same to a reference voltage $V_{ref}$ which may be equivalent to one half (½) the voltage which is impressed across the combination of both the external resistor $R_{EXT}$ and the active parallel legs of transistors within transistor block $TB_0$. If $V_{div}$ is larger than $V_{ref}$, the comparator COMP outputs a count down signal D as a signal to decrease a number of legs which are active so as to increase the resistance provided by $TB_0$. In contrast, If $V_{div}$ is smaller than $V_{ref}$, the comparator COMP outputs a count up signal U as a signal to increase a number of legs which are active so as to decrease the resistance provided by $TB_0$. The comparator COMP may be constructed to produce no output or invoke no count-up or count-down at times when $V_{div}$ is equal to $V_{ref}$. An Up/Down Counter connected to receive the signal U/D, will count up in a binary fashion responsive to count up signal U or will count down responsive to count down signal D and will generate a plurality of control bits on binary bit lines $B_1$, $B_2$, $B_3$, $B_4$, $B_5$. The resulting circuit is a self-contained feedback control loop circuit which feeds back a voltage which indicates the impedance matching.

The feedback control loop circuit calibrates the transistor stages within the IC chip so that their cumulative impedance is equal to that of the 50 ohm external resistor. If there are PVT variations within the IC chip which cause the impedance of the transistors to change, the absence of an equilibrium between internal and external impedances is detected and compensated for in the feedback loop so that the internal impedance remains equal to the external impedance. In particular, the control bits generated by the Up/Down counter change so that transistor stages (of pullup and pulldown transistors) are either activated or deactivated so that the resulting combination of stages provides a cumulative internal impedance equal to the external impedance.

Although not shown in FIG. 5 for clarity, there may be a filter (which may consist simply of a resistor and capacitor or may have some other arrangement) interposed between $R_{EXT}$ and comparator COMP. There may also be a sampling circuit and a digital filter interposed between comparator COMP and the Up/Down Counter.

Figure 6:
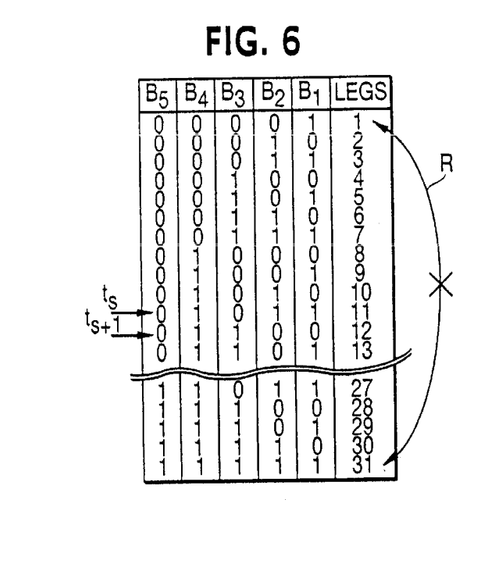
FIG. 6 is a table (having a partial cut-away for compactness of illustration) useful in describing operation of the FIG. 5 binary adaptive arrangement.

The table in FIG. 6 illustrates a binary count sequence which can be applied as assertion signals to binary bit lines $B_1$, $B_2$, $B_3$, $B_4$, $B_5$, and the number of corresponding P/N transistor legs or pairs which are activated at each binary count. For example, if a binary count value of "00111" is applied to binary bit lines $B_5$, $B_4$, $B_3$, $B_2$, $B_1$, seven (7) P/N transistor legs or pairs would be activated in parallel to each other, and would provide a corresponding resistance value connected to a line $L_0$.

The arrangement in FIG. 5 may be constructed/arranged to begin with any initial count value upon initialization. For example, the Up/Down Counter may be pre-loaded with a count of one or "00001" upon initialization. However, pre-loading at the end of the range has the disadvantage that the adaptive operation may take a substantial period of time in cases where the Up/Down Counter must count across a majority of the range (e.g., to a high count value (e.g., 28 out of 31)) to adapt the impedance to $R_{ext}$. Alternatively, the Up/Down Counter may be pre-loaded with a mid-range count value, e.g., of binary fifteen or "01111", in an attempt to minimize a possible range which might have to be traversed and a time which might be needed during initialization.

Example Update Schemes

Figure 7:
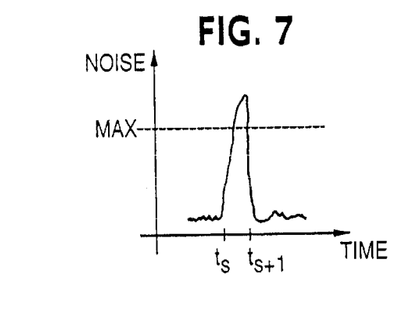
FIG. 7 is a simplified diagram of an adaptive impedance matching circuit.

As noted in the background, the impedance matching procedure is performed "continuously" throughout operation of the IC chip because its environmental parameters (e.g., voltage, temperature, etc.) change over time (e.g., it becomes hotter with operation which changes on-die impedances). However, the impedance matching may not be performed while the I/O drivers are active and transferring data because unacceptable noise may be produced when activating/deactivating P/N transistor legs. FIGS. 6 and 7 illustrate one example of such situation, and a disadvantage resultant therefrom.

Assume that at a first switching time $t_S$ the Up/Down Counter is at a binary count of "01011" having eleven (11) total legs within $BTB_1$, $BTB_2$, $BTB_4$, active, and that at a subsequent switching time $t_{S+1}$, the Up/Down Counter is counted to a next binary count of "01100" having twelve (12) total legs within $BTB_3$, $BTB_4$, active. If $BTB_1$, $BTB_2$ (containing three P/N transistor legs) are deactivated before $BTB_3$ (containing four P/N transistor legs) is activated, the transistor block $TB_0$ initially having eleven legs (11) active will first transition to having only eight (8) legs active, and then will jump to having twelve (12) legs active. Such jumps in active P/N transistor legs correspondingly result in jumps in impedance impressed by transistor block $TB_0$ upon line $L_0$, and all other on-die transistor blocks $TB_N$, $TB_{N+1}$, •••, conduct similar switching/jumping. The result is widely varying impedance matching over a short period of time which might cause partial reflection of a signal incoming from a transmission line IL. Further, if a transmission line is low because one of the drivers is active, the impedance transition may launch a wave onto the transmission line. If a maximum noise level acceptable by ICs upon the lines L and transmission lines IL (without causing erroneous operation) is given by MAX in the FIG. 7 time/noise graph, the switching/jumping may result in a glitch as illustrated in FIG. 7. The result could be catastrophic if, for example, the glitch occurs in the strobe signal of a source synchronous and causes all data timings to be incorrect.

If the Up/Down Counter were constructed/arranged to allow a wrap-around down count from 00001→11111, or a wrap-around up count from 11111→00001 (both situations represented by the FIG. 6 wrap-around arrow R), a substantial leg/impedance jump between one (1) and thirty-one (31) legs would occur, causing a massive wave launch and/or noise glitch on the lines $L_0$, $L_N$, $L_{N+1}$, ••• and transmission lines $IL_0$, $IL_N$, $IL_{N+1}$, •••. Accordingly, the Up/Down Counter may be arranged to prohibit wrap-around counting, such prohibition being illustrated by the "X" drawn through the FIG. 6 wrap-around arrow R.

To accommodate selectivity, the Up/Down Counter may have enable inputs EN to selectively enable/disable continued count up/down, and which can be selectively enabled for times when the adaptive procedure is desired to be performed under different update schemes. The example embodiments are not limited to enable inputs at the Up/Down Counter, and alternatively, other components can be arranged to instead allow selective enabling of the adaptive procedure, e.g., the comparator may be arranged to selectively enable/disable feedback of the count signal U/D; a latch can be provided to latch the count value from the Up/Down counter and apply the same to the binary bit lines $B_1$, $B_2$, $B_3$, $B_4$, $B_5$; etc.

The update scheme can have a significant effect on performance of an adaptive impedance matching arrangement. If impedance matching is performed only when the data bus is idle for a fixed period of time or clock cycles, the impedance matching is not truly "continuous". It may be quite a long time before the data bus is idle for the fixed period of time or clock cycles, during which impedance matching is not performed. If the temperature happens to change significantly or the impedance otherwise drifts during that period, the impedance becomes mismatched. If the enable bits for the Up/Down counter are delayed for a fixed or variable number of cycles to try to take advantage of the $T_{co}$ delay inherent in the I/O driver, it is a complicated scheme requiring a complex circuit to determine when the system is idle and/or how much delay is required, etc.

Figure 8:
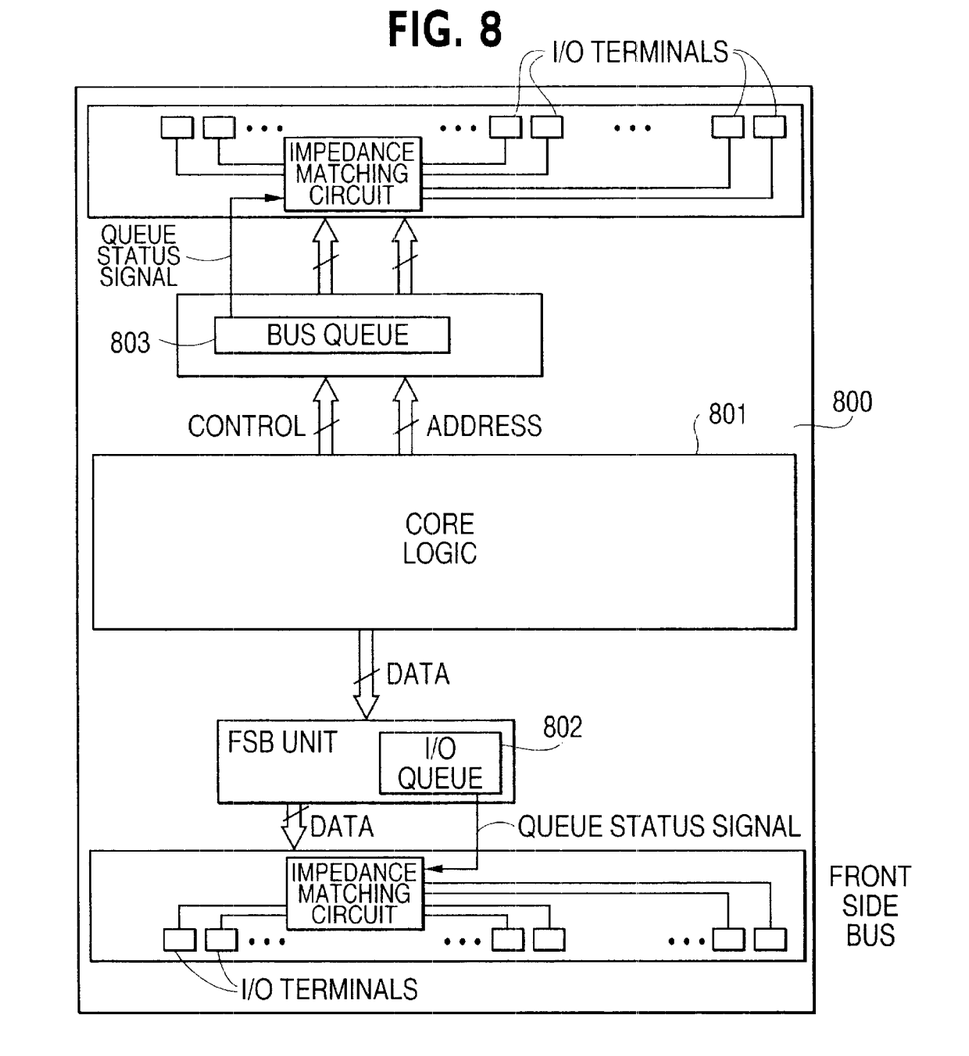
FIG. 8 is a diagram showing the elements of an IC chip having a digital update scheme according to an example embodiment of the invention.

The update scheme according to the example embodiments of the invention will now be described with reference to a microprocessor IC chip 800 shown in FIG. 8, although it may be utilized in any type of IC chip. The update scheme in the example embodiments uses a first-in-first-out (FIFO) buffer in a stage between the core logic 801 of the microprocessor IC chip and the I/O terminals to determine when to update the impedance matching control bits. The example microprocessor chip shown in FIG. 8 has two buses: a data bus (referred to as a front side bus) for externally transferring data and a back side bus for externally driving address and control signals. In the case of microprocessor IC 800, the update scheme uses I/O queue 802 for the front side bus and bus queue 803 for the other bus. The I/O queue 802 maintains a list of current and pending transactions for controlling the sequence of events on the data bus. The bus queue 803 maintains a list of transactions that are pending for the other bus.

A signal is supplied to a control circuit such as that described with reference to FIG. 5, for example, to the enable input of an Up/Down counter, which indicates when the I/O queue 802 is empty. This signal guarantees that the data is not being driven on the data bus during the current bus clock cycle. Similarly, a signal to a similar control circuit for the back side bus which indicates that the bus queue are empty. This signal indicates that no address or control signals are being driven on the bus.

The resulting update scheme is a simple logic that leverages the states of the bus queue and I/O queue to decide when to update the impedance. This update scheme of the example embodiments ensures that impedance matching for the buses is be enabled only during the time when the respective queues are empty. However, the example embodiments don't have the complications that they wait for a fixed period of time and don't wait for the bus to be idle.

The update scheme of the example embodiments have the advantage that they are independent of the bus clock ratio and have no delay circuit. It also allows a limited number of control bits to be routed to the transistor block for each transmission line when there are a large number of transmission lines.

In concluding, reference in the specification to "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance, i.e., some procedures may be able to be performed in an alternative ordering, simultaneously, etc.

This concludes the description of the example embodiments. Although the example embodiments have been affirmatively described with reference to a number of features, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure and the drawings. In addition to variations and modifications in the component parts and/or arrangements, alternative uses will also be apparent to those skilled in the art.

For example, with regard to the multiple stages of impedance matching transistor legs, practice of the present invention is not limited to the above-mentioned implementations, but instead, any other implementation may be provided. For example, the number of stages and difference between the impedance value of the levels may be optimally selected to meet specifications and to satisfactorily match impedance at the anticipated operating corners, i.e., maximum and minimum of process variations, voltage and temperature extremes. Furthermore, although the example embodiments are described with respect to a microprocessor IC chip, the invention may be applied to input/output circuits in any environment, such as, for example, communications products.

What is claimed is:

1. An adaptive impedance matching arrangement, comprising:
   an adaptive impedance circuit allowing impedance matching for a bus, the impedance of said adaptive impedance circuit being controlled according to a plurality of control bits; and
   a control circuit supplying said plurality of control bits, wherein said plurality of control bits are updated according to a signal indicating the state of a queue maintaining transactions for said bus.

2. An adaptive impedance matching arrangement as claimed in claim 1, wherein said adaptive impedance circuit has binary weighted transistor stages.

3. An adaptive impedance matching arrangement as claimed in claim 2, wherein said control circuit is enabled/disabled according to the value of said signal indicating the state of said queue.

4. An adaptive impedance matching arrangement as claimed in claim 1, comprising a plurality of said adaptive impedance circuits and a dummy adaptive impedance circuit which is operable to adapt to a predetermined impedance, and wherein the impedance of at least one adaptive impedance circuit of said plurality of adaptive impedance circuits is adapted to utilize information from said dummy adaptive impedance circuit.

5. An adaptive impedance matching arrangement as claimed in claim 1, comprising a plurality of said adaptive impedance circuits, each one of said adaptive impedance circuits allowing impedance matching for a respectively corresponding transmission line.

6. An impedance matching arrangement as claimed in claim 1, wherein said queue is provided as a portion of an integrated circuit (IC) die.

7. An impedance matching arrangement as claimed in claim 6, wherein said integrated circuit (IC) includes a microprocessor and said queue is located between said microprocessor and the I/O terminals of said integrated circuit.

8. An impedance matching arrangement as claimed in claim 1, wherein said control circuit has a counter which is incremented or decremented to provide a predetermined impedance matching value.

9. An integrated circuit chip, comprising:
   a core logic;
   a queue maintaining transaction to be transferred between said core logic and external transmission lines; and
   a plurality of I/O terminals connected to said transmission lines, each one of said plurality of I/O terminals transferring a signal between said core logic and its respective transmission line and including:
      an adaptive impedance circuit allowing impedance matching for the transmission line, the impedance of said adaptive impedance circuit being controlled according to a plurality of control bits; and
      a control circuit supplying said plurality of control bits, wherein said plurality of control bits are updated according to a signal indicating the state of said queue.

10. An integrated circuit chip as claimed in claim 9, wherein said control circuit is enabled by said signal indicating the state of a queue maintaining transactions for said transmission line.

11. An integrated circuit chip as claimed in claim 10, wherein said adaptive impedance circuit has binary weighted transistor stages.

12. An integrated circuit chip as claimed in claim 9, wherein said signal indicates whether or not said queue is empty.

13. A method of matching the impedance of a transmission line, said method comprising:

supplying control bits activating respective transistor stages to an adaptive impedance matching circuit;

sending a signal to a control circuit generating said control bits indicating whether or not a queue maintaining a list of transactions is empty; and updating said control bits only when said signal indicates that said queue is empty.

14. A method according to claim 13, wherein said control circuit is disabled/enabled by said signal.

* * * * *